United States Patent
Cho

(10) Patent No.: US 7,948,801 B2
(45) Date of Patent: May 24, 2011

(54) NONVOLATILE MEMORY DEVICE WITH EXPANDED TRIMMING OPERATIONS

(75) Inventor: Ji-ho Cho, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 185 days.

(21) Appl. No.: 12/467,501

(22) Filed: May 18, 2009

(65) Prior Publication Data

US 2009/0296483 A1    Dec. 3, 2009

(30) Foreign Application Priority Data

Jun. 3, 2008  (KR) ................. 10-2008-0052255

(51) Int. Cl.
*G11C 11/34* (2006.01)
*G11C 16/04* (2006.01)

(52) U.S. Cl. .......................... 365/185.18; 365/185.33

(58) Field of Classification Search ............. 365/185.18, 365/185.23, 185.33
See application file for complete search history.

(56) References Cited

U.S. PATENT DOCUMENTS

| 6,888,751 B2 * | 5/2005 | Makuta et al. | ........... 365/185.09 |
| 2002/0054507 A1 * | 5/2002 | Makuta et al. | ........... 365/185.09 |
| 2006/0221681 A1 * | 10/2006 | Misumi et al. | ........... 365/185.01 |

FOREIGN PATENT DOCUMENTS

| JP | 2001216034 A | 8/2001 |
| JP | 2004055081 A | 2/2004 |
| KR | 1020070084580 A | 8/2007 |

* cited by examiner

*Primary Examiner* — Anh Phung
(74) *Attorney, Agent, or Firm* — Volentine & Whitt, PLLC

(57) ABSTRACT

A nonvolatile memory device includes a trimming cell array storing trimming data for a plurality of operating modes, a trimming cell sense amplifier sensing the trimming data and a trimming cell latch storing the sensed trimming data. A plurality of trimming circuits performs trimming operations in response to a trimming control signals derived from trimming data. A single temporary trimming control logic unit receives externally provided control data and controls operation of a single summation circuit. The summation circuit controls the operation of the trimming circuits by respectively and selectively varying the trimming control signal provided to each one of the plurality of trimming circuits in response to the externally provided control data.

10 Claims, 4 Drawing Sheets

NONVOLATILE MEMORY DEVICE WITH EXPANDED TRIMMING OPERATIONS

CROSS-REFERENCE TO RELATED APPLICATION

This application claims the benefit of Korean Patent Application No. 10-2008-0052255 filed on Jun. 3, 2008, the subject matter of which is hereby incorporated by reference.

BACKGROUND

The invention relates to semiconductor memory devices. More particularly, the invention relates to nonvolatile memory devices having extension of a trimming operation by reducing a chip area thereof.

Electrically re-writable nonvolatile memory devices, such as flash memory, are increasingly used in contemporary electronics due to their high integration density and superior performance characteristics. As is conventionally understood, proper operation of a semiconductor memory device requires the definition and maintenance of certain operating voltages.

The level of operating voltages may be precisely defined in a process commonly referred to as "trimming." The trimming of an operating voltage within a flash memory device may be performed in relation to so-called "trimming data." Trimming data may be stored, for example, in a predetermined portion of the memory array of a constituent flash memory device. Trimming data may be used to adjust operating voltages within defined modes of operation for the flash memory device (e.g., a read mode, a program mode, a delete mode, etc.). By carefully adjusting operating voltages within a flash memory device, the performance of certain circuitry (e.g., control sense amplifiers, a reference cell, etc.) may be optimized. Trimming improves the consistency with which a flash memory device operates, and may be used to compensate for non-uniformities in the device manufacturing processes.

FIG. (FIG.) 1 is a schematic diagram illustrating a conventional nonvolatile memory device 100. Referring to FIG. 1, nonvolatile memory device 100 includes a trimming cell array 110 storing trimming data, a trimming cell sense amplifier and a write driver 120 sensing the trimming data, and a trimming cell latch 130 storing the sensed trimming data. These circuits generally operate under the control of a trimming cell control logic unit 140.

Sensed trimming data stored in trimming cell latch 130 is provided to various trimming circuits including a read trimming circuit 150, a program trimming circuit 160, a deletion trimming circuit 170. It may also be provided to an estimation trimming circuit (not shown). Each trimming circuit variously trims certain operating voltages in order to optimize sense amplifiers, reference cells, etc., of nonvolatile memory device 100.

Trimming circuits 150, 160 and 170 respectively include trimming units 151, 161 and 171 performing defined trimming operations in accordance with trimming control signals (e.g., signal_1, signal_2 . . . , signal_N) derived from the trimming data provided from trimming cell latch 130. Trimming circuits 150, 160 and 170 may be required to temporarily vary (or adjust) the trimming control signals in relation to the trimming data provided from trimming cell latch 130. For example, trimming circuits 150, 160 and 170 may be required to vary respective trimming control signals according to certain "down-trimming" or "up-trimming" control data. Such trimming control data may be externally provided in response to any number of control factors.

Variance of trimming control signals may be achieved within trimming circuits 150, 160 and 170 by means of temporary trimming control logic units 152, 162 and 172 and corresponding summers 153, 163 and 173. Temporary trimming control logic units 152, 162 and 172 respectively receive externally provided control data (e.g., temporary trimming data Ex_Trim_1, Ex_Trim_2 . . . , and Ex_Trim_N), and control operation of summers 153, 163 and 173 to vary the trimming control signals Signal_1, Signal_2 . . . and Signal_N.

However, the incorporation of respective temporary trimming control logic units 152, 162 and 172 and summers 153, 163 and 173 within constituent trimming circuits 150, 160 and 170 increases the overall chip area required to implement nonvolatile memory device 100. Unfortunately, when the number of trimming circuits is limited in conventional nonvolatile memory devices due to concerns over chip area utilization, the number of trimming operations operatively provided within the device must also be reduced.

SUMMARY

Embodiments of the invention provide a nonvolatile memory device with expanded trimming operations without adversely impacting chip area utilization.

In one embodiment, the invention provides a nonvolatile memory device comprising; a trimming cell array configured to store trimming data respectively associated with a plurality of operating modes for the nonvolatile memory device, a trimming cell sense amplifier configured to sense the trimming data stored in the trimming cell array, a trimming cell latch configured to store sensed trimming data, a plurality of trimming circuits, each performing a trimming operation related to one operating mode of the plurality of operating modes in response to a trimming control signal derived from trimming data associated with the one operating mode, a single temporary trimming control logic unit configured to receive externally provided control data and configured to control operation of a single summation circuit, wherein the single summation circuit is configured to control the operation of each one of the plurality of trimming circuits by respectively and selectively varying the trimming control signal provided to each one of the plurality of trimming circuits in response to the externally provided control data.

In another embodiment, the invention provides a nonvolatile memory device comprising; a trimming cell array comprising main trimming cells configured to store main trimming data and temporary trimming cells configured to store temporary trimming data, a main trimming cell sense amplifier configured to sense the main trimming data stored in the main trimming cells, a temporary trimming cell sense amplifier configured to sense the temporary trimming data stored in the temporary trimming cells, a temporary common control logic unit configured to provide the temporary trimming data sensed by the temporary trimming cell sense amplifier to a temporary common summation circuit, wherein the temporary common summation circuit varies the main trimming data sensed by the main trimming cell sense amplifier according to the temporary trimming data provided by the temporary common control logic unit, and at least one trimming latch storing the varied main trimming data.

BRIEF DESCRIPTION OF THE DRAWINGS

Embodiments of the invention will be more clearly understood from the following detailed description made with reference to the accompanying drawings in which.

DESCRIPTION OF EMBODIMENTS

Figure 1:
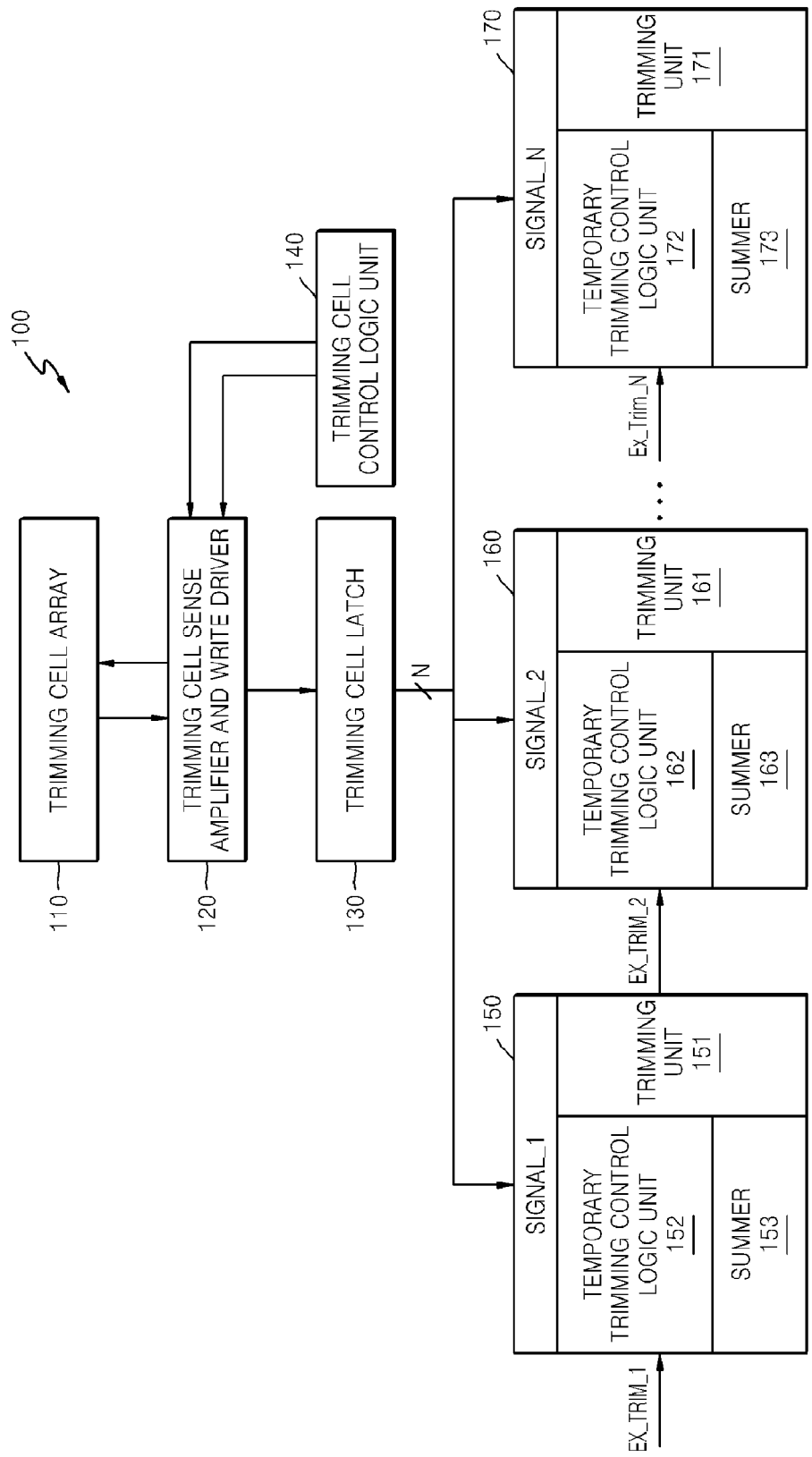
FIG. 1 is a schematic diagram illustrating a conventional nonvolatile memory device.

Certain embodiments illustrated in the attached drawings will now be described. However, the invention may be variously embodied and should not be construed as being limited to only the illustrated embodiments. Throughout the written description and drawings like reference numerals and labels designate like or similar elements or signals.

Figure 2:
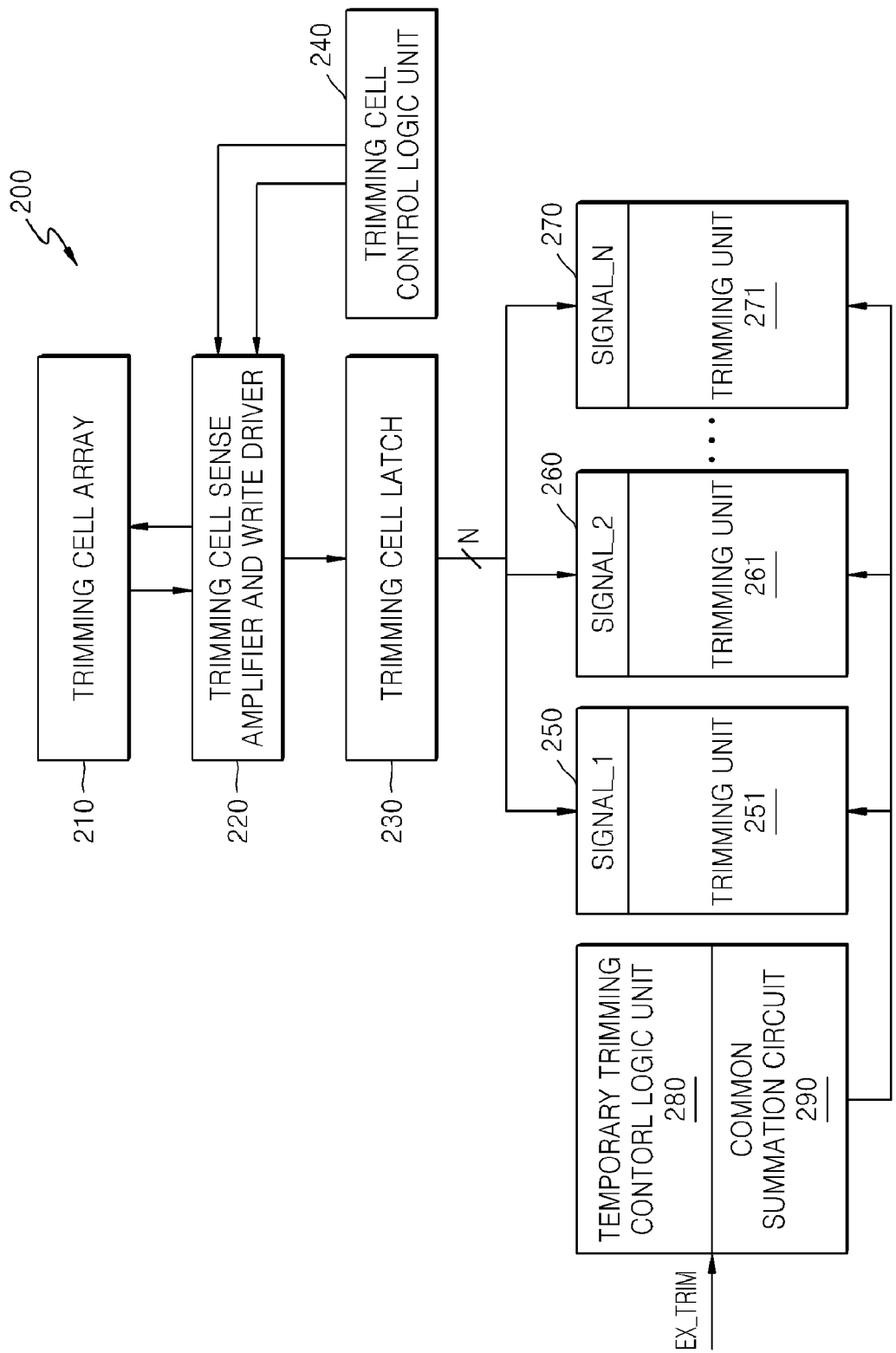
FIG. 2 is a schematic diagram illustrating a nonvolatile memory device according to an embodiment of the invention.

FIG. 2 is a schematic diagram illustrating a nonvolatile memory device 200 according to an embodiment of the invention. Referring to FIG. 2, nonvolatile memory device 200 comprises a trimming cell array 210, a trimming cell sense amplifier and a write driver 220, a trimming cell latch 230, and a trimming cell control logic unit 240. Nonvolatile memory device 200 also comprises trimming circuits 250, 260 and 270, as well as a temporary trimming control logic unit 280, and a summation circuit 290, each commonly shared by trimming circuits 250, 260 and 270.

Trimming cell array 210 stores trimming data. For example, NOR flash memory may be used to implement trimming cell array 210. The stored trimming data may be viewed as a set of reference value used to trim certain operating voltages, sense amplifiers and reference cells in relation to corresponding operating modes of nonvolatile memory device 200.

Trimming cell sense amplifier and the write driver 220 may be used to sense the trimming data stored in trimming cell array 210 or to program (update) the trimming data into trimming cell array 210 using conventionally understood techniques.

Trimming cell latch 230 stores trimming data sensed by trimming cell sense amplifier 220.

Trimming cell control logic unit 240 controls the overall operation of trimming cell sense amplifier and the write driver 220 to sense trimming data stored in trimming cell array 210, store the sensed trimming data in trimming cell latch 230 and/or program updated trimming data to trimming cell array 210.

In the illustrated embodiment, trimming circuits 250, 260 and 270 respectively comprise a read trimming unit 251, a program trimming unit 261, and a deletion trimming unit 271. An estimation trimming unit (not shown) may be additionally provided. Trimming circuits 250, 260 and 270 operate to trim voltages, sense amplifiers and reference cells in relation to trimming control signals (e.g., Signal_1, Signal_2 . . . , and Signal_N) derived from trimming date stored in trimming cell latch 230. Trimming data may be provided from trimming cell latch 230 to trimming circuits 250, 260 and 270 via a data bus configured from N data signal lines.

Temporary trimming control logic unit 280 receives externally provided trimming control data (or corresponding control signals, e.g., "Ex_Trim') in order to vary (or adjust) the trimming control signals (e.g., Signal_1, Signal_2 . . . , and Signal_N) and control operation of common summation circuit 290. The externally provided trimming control data, Ex_Trim, may be viewed as a set of control values used to vary the trimming control signals, Signal_1, Signal_2 . . . , and Signal_N, in relation to one or more factors.

Common summation circuit 290 varies the trimming control signals, Signal_1, Signal_2 . . . , and Signal_N, provided by trimming circuits 250, 260 and 270 using, for example, up or down-trimming techniques. Properly varied trimming control signals are then respectively provided to trimming units 251, 261 and 271 within trimming circuits 250, 260 and 270.

By using a single temporary trimming control logic unit 280 and a single common summation circuit 290, the chip area occupied in nonvolatile memory device 200 by the collection of trimming circuitry is remarkably reduced as compared to the conventional nonvolatile memory device 100 illustrated in FIG. 1.

Figure 3:
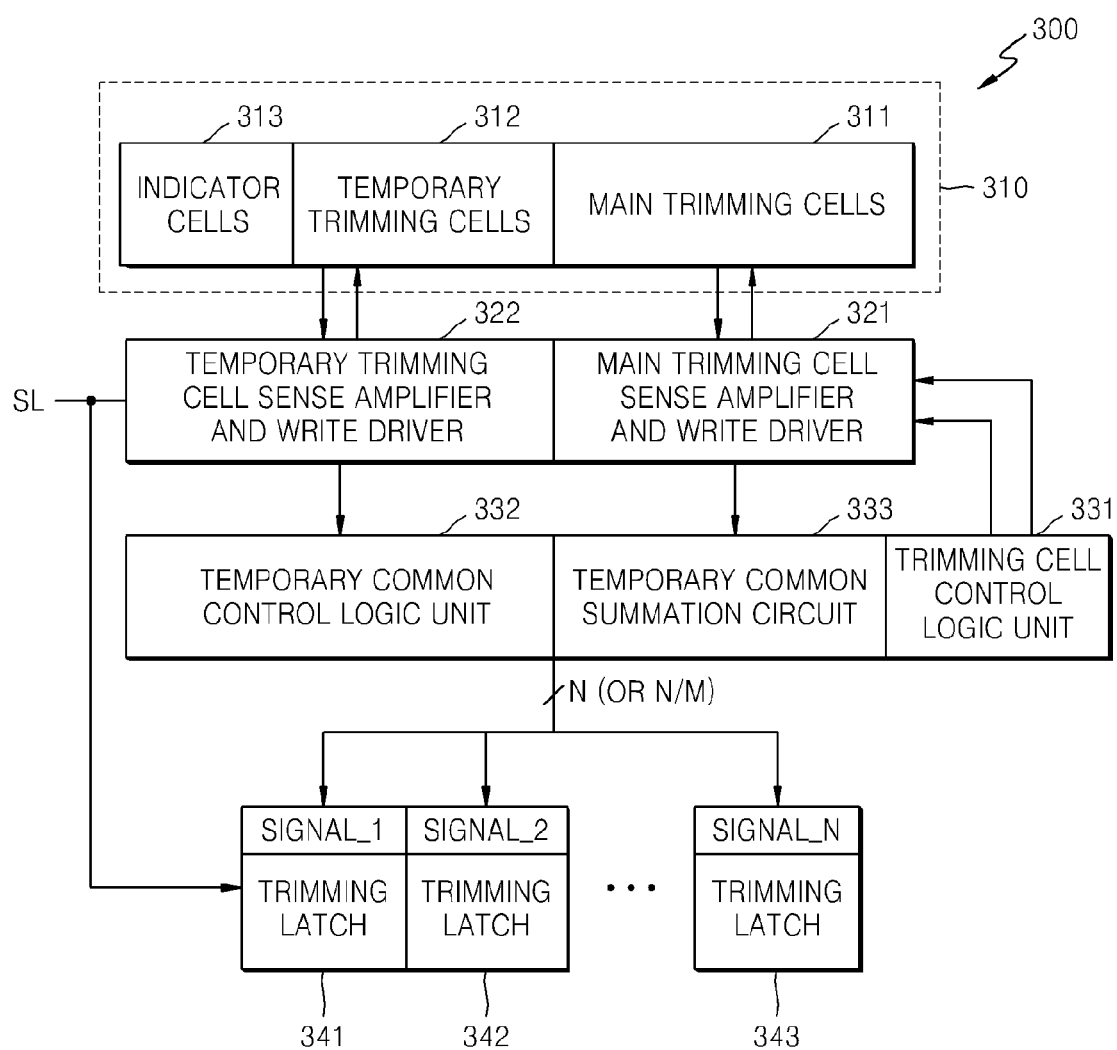
FIG. 3 is a schematic diagram illustrating a nonvolatile memory device according to another embodiment of the invention.

FIG. 3 is a schematic diagram illustrating a nonvolatile memory device 300 according to another embodiment of the invention. Referring to FIG. 3, nonvolatile memory device 300 comprises a trimming cell array 310, a main trimming cell sense amplifier and a write driver 321, a temporary trimming cell sense amplifier and a write driver 322, a trimming cell control logic unit 331, a temporary common control logic unit 332, a temporary common summation circuit 333, and trimming latches 341, 342 and 343.

Trimming cell array 310 includes main trimming cells 311, temporary trimming cells 312 and indicator cells 313. Main trimming cells 311 store main trimming data and temporary trimming cells 312 store temporary trimming data. Indicator cells 313 select trimming data from either main trimming cells 311 or temporary trimming cells 312.

The main trimming cell sense amplifier and the write driver 321 may be used to sense main trimming data stored in main trimming cells 311 or to program updated main trimming data to main trimming cells 311. The temporary trimming cell sense amplifier and the write driver 322 may be used to sense temporary trimming data stored in temporary trimming cells 312 or to program updated temporary trimming data to temporary trimming cells 312. The trimming cell control logic unit 331 controls the main trimming cell sense amplifier, the writer driver 321, the temporary trimming cell sense amplifier and the write driver 322 to sense the main trimming data stored in the main trimming cells 311 and the temporary trimming data stored in the temporary trimming cells 312, store the main trimming data in the main trimming cells 311, store the temporary trimming data in the temporary trimming cells 312.

The temporary common control logic unit 332 outputs the temporary trimming data sensed by the temporary trimming cell sense amplifier and the write driver 322 to the temporary common summation circuit 333. The temporary common summation circuit 333 varies the main trimming data sensed by the main trimming cell sense amplifier and the write driver 321 according to the temporary trimming data output from the temporary common control logic unit 332. The temporary common control logic unit 332 outputs varied main trimming control signals Signal_1, Signal_2 . . . and Signal_N to corresponding trimming latches 341, 342 and 343 through N bus signal lines. The trimming latches 341, 342 and 343 are respectively connected to trimming circuits (not shown) to perform (e.g.) down-trimming or up-trimming according to the varied main trimming data signals Signal_1, Signal_2 . . . , and Signal_N.

Accordingly, nonvolatile memory device 300 may vary the main trimming control signals using the temporary trimming data previously stored in temporary trimming cells 312 when power is applied to nonvolatile memory device 300. Furthermore, the overall chip area of nonvolatile memory device 300 occupied by trimming circuitry is remarkably reduced by varying the main trimming data using a single temporary common control logic unit 332 and a single temporary common summation circuit 333.

Figure 4:
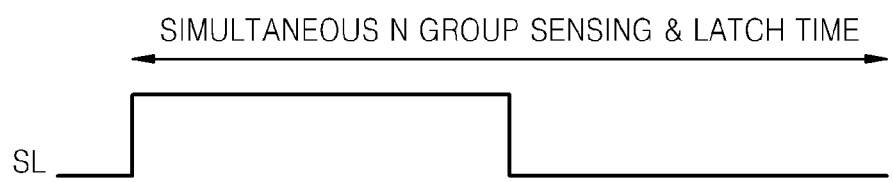
FIGS. 4 and 5 are related timing diagrams illustrating a trimming data sensing and latching signal of the nonvolatile memory device illustrated in FIG. 3.
Figure 5:
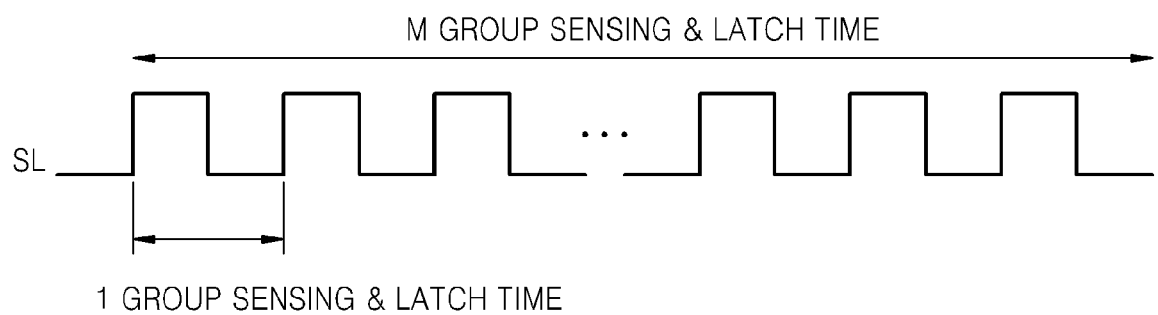

FIGS. 4 and 5 are related timing diagrams illustrating trimming data sensing and latching signals (SL) provided in nonvolatile memory device 300 illustrated in FIG. 3. The trimming data sensing and latching signal SL drives the main trimming cell sense amplifier, the write driver 321, the temporary trimming cell sense amplifier, the write driver 332, and the trimming latches 341, 342 and 343. Referring to FIG. 4, N trimming control signals (or corresponding trimming data) are stored respectively in N trimming latches 341, 342 and 342 during a single enable period of the trimming data sensing and latching signal SL. Here, the N trimming control signals are stored in the corresponding trimming latches 341, 342 and 343 through N bus lines.

Referring to FIG. 5, the N trimming control signals are respectively stored in the N trimming latches 341, 342 and 342 in M, where M<N, during enable periods of the trimming data sensing and latching signal SL. Here, the N trimming control signals are stored in the corresponding trimming latches 341, 342 and 343 through N/M bus lines. In this case, the number of bus lines that transmit the trimming data signals to the trimming latches 341, 342 and 343 is reduced to N/M, and thus a bus line routing area of the nonvolatile memory device 300 can be decreased to result in an overall reduction in occupied chip area of nonvolatile memory device 300.

While the inventive concept has been particularly shown and described with reference to exemplary embodiments thereof, it will be understood that various changes in form and details may be made therein without departing from the scope of the following claims.

What is claimed is:

1. A nonvolatile memory device comprising:
   a trimming cell array configured to store trimming data respectively associated with a plurality of operating modes for the nonvolatile memory device;
   a trimming cell sense amplifier configured to sense the trimming data stored in the trimming cell array;
   a trimming cell latch configured to store sensed trimming data;
   a plurality of trimming circuits, each performing a trimming operation related to one operating mode of the plurality of operating modes in response to a trimming control signal derived from trimming data associated with the one operating mode;
   a single temporary trimming control logic unit configured to receive externally provided control data and configured to control operation of a single summation circuit, wherein the single summation circuit is configured to control the operation of each one of the plurality of trimming circuits by respectively and selectively varying the trimming control signal provided to each one of the plurality of trimming circuits in response to the externally provided control data.

2. The nonvolatile memory device of claim 1, wherein the plurality of trimming circuits comprises:
   a read trimming unit, a program trimming unit, and a deletion trimming unit, respectively associated with a read operation, a program operation, and a deletion operation for the nonvolatile memory device.

3. The nonvolatile memory device of claim 1, wherein the trimming cell sense amplifier comprises a write driver configured to program updated trimming data to the trimming cell array.

4. The nonvolatile memory device of claim 3, further comprising:
   a trimming cell control logic unit configured to control the trimming cell sense amplifier and the write driver to sense the trimming data stored in the trimming cell array and program the updated trimming data to the trimming cell latch.

5. The nonvolatile memory device of claim 1, wherein the trimming cell array is implemented using NOR flash memory cells.

6. A nonvolatile memory device comprising:
   a trimming cell array comprising main trimming cells configured to store main trimming data and temporary trimming cells configured to store temporary trimming data;
   a main trimming cell sense amplifier configured to sense the main trimming data stored in the main trimming cells;
   a temporary trimming cell sense amplifier configured to sense the temporary trimming data stored in the temporary trimming cells;
   a temporary common control logic unit configured to provide the temporary trimming data sensed by the temporary trimming cell sense amplifier to a temporary common summation circuit;
   wherein the temporary common summation circuit varies the main trimming data sensed by the main trimming cell sense amplifier according to the temporary trimming data provided by the temporary common control logic unit; and
   at least one trimming latch storing the varied main trimming data.

7. The nonvolatile memory device of claim 6, wherein the trimming cell array further comprises an indicator cell selecting the main trimming cells or the temporary trimming cells.

8. The nonvolatile memory device of claim 7, wherein the trimming cell array is implemented using NOR flash memory cells.

9. The nonvolatile memory device of claim 6, wherein the varied main trimming data provided by the temporary common summation circuit is provided to the at least one trimming latch via a plurality of N bus signal lines during a single enable period of a trimming data sensing and latching signal, where N is equal to a number of trimming operations performed within the nonvolatile memory device.

10. The nonvolatile memory device of claim 6, wherein the varied main trimming data provided by the temporary common summation circuit is provided to the at least one trimming latch via N/M bus signal lines during M enable periods of a trimming data sensing and latching signal, where N is equal to a number of trimming operations performed within the nonvolatile memory device and M is less than or equal to N.

* * * * *